United States Patent [19]
Manning

[11] Patent Number: 5,981,397
[45] Date of Patent: *Nov. 9, 1999

[54] INTEGRATED CIRCUITRY HAVING A PAIR OF ADJACENT CONDUCTIVE LINES AND METHOD OF FORMING

[75] Inventor: Monte Manning, Kuna, Id.

[73] Assignee: Micron Technology, Inc., Boise, Id.

[*] Notice: This patent is subject to a terminal disclaimer.

[21] Appl. No.: 09/186,252

[22] Filed: Nov. 4, 1998

Related U.S. Application Data

[63] Continuation of application No. 08/898,530, Jul. 22, 1997, which is a continuation of application No. 08/580,281, Dec. 27, 1995, Pat. No. 5,677,241.

[51] Int. Cl.⁶ .................................................. H01L 21/44
[52] U.S. Cl. ........................... 438/701; 438/978; 438/703
[58] Field of Search .................... 438/701, 624, 438/690, 978, 703

[56] References Cited

U.S. PATENT DOCUMENTS

| | | | |
|---|---|---|---|
| 5,001,079 | 3/1991 | Van Laarhoven et al. | 437/50 |
| 5,004,704 | 4/1991 | Maeda et al. | 437/195 |
| 5,124,275 | 6/1992 | Selle et al. | 437/80 |
| 5,192,715 | 3/1993 | Sliwa, Jr. et al. | 437/195 |
| 5,217,926 | 6/1993 | Langley | 437/228 |
| 5,278,103 | 1/1994 | Mallon et al. | 437/240 |
| 5,290,358 | 3/1994 | Rubloff et al. | 118/715 |
| 5,310,700 | 5/1994 | Lien et al. | 437/195 |
| 5,346,585 | 9/1994 | Doan et al. | 156/643 |
| 5,391,921 | 2/1995 | Kudoh et al. | 257/758 |
| 5,407,860 | 4/1995 | Stoltz et al. | 437/180 |
| 5,416,048 | 5/1995 | Blalock et al. | 437/187 |
| 5,461,003 | 10/1995 | Havemann et al. | 437/187 |
| 5,494,853 | 2/1996 | Lur . | |
| 5,506,173 | 4/1996 | Nishimoto . | |
| 5,510,645 | 4/1996 | Fitch et al. | 257/522 |
| 5,512,775 | 4/1996 | Cho | 257/522 |
| 5,514,832 | 5/1996 | Dusablon, Sr. et al. | 174/151 |
| 5,516,720 | 5/1996 | Lur et al. | 437/67 |
| 5,519,250 | 5/1996 | Numata | 257/632 |
| 5,530,290 | 6/1996 | Aitken et al. | 257/758 |
| 5,545,919 | 8/1996 | Ueda et al. | 257/641 |
| 5,548,159 | 8/1996 | Jeng | 257/634 |
| 5,599,745 | 2/1997 | Reinberg | 437/195 |
| 5,677,241 | 10/1997 | Manning . | |
| 5,698,467 | 12/1997 | Sakao et al. . | |
| 5,773,361 | 6/1998 | Cronin et al. . | |

FOREIGN PATENT DOCUMENTS 2-151032  6/1990  Japan ........................................ 21/316

*Primary Examiner*—Caridad Everhart
*Attorney, Agent, or Firm*—Wells, St. John, Roberts, Gregory & Matkin, P.S.

[57] ABSTRACT

A method of forming integrated circuitry includes, a) providing a pair of spaced and adjacent electrically conductive elongated lines; and b) providing electrically insulative material over the pair of spaced lines in a manner which leaves an elongated void between the lines, the elongated void being top sealed along its substantial elongated length. Preferably, the electrically insulative material is provided by depositing electrically insulative material over the pair of lines in a manner which produces a retrograde cross-sectional profile of the insulating material relative to the respective line sidewalls and which leaves an elongated top sealed void within the insulating material between the lines, the elongated void being open at at least one end. The void at the one end is subsequently sealed. Integrated circuitry of the invention included, i) a pair of spaced and adjacent electrically conductive elongated lines; and ii) the pair of conductive lines being encapsulated with an electrically insulative material, a top sealed elongated void provided relative to the electrically insulative material between the lines facilitating electrical isolation of the lines from one another.

14 Claims, 10 Drawing Sheets

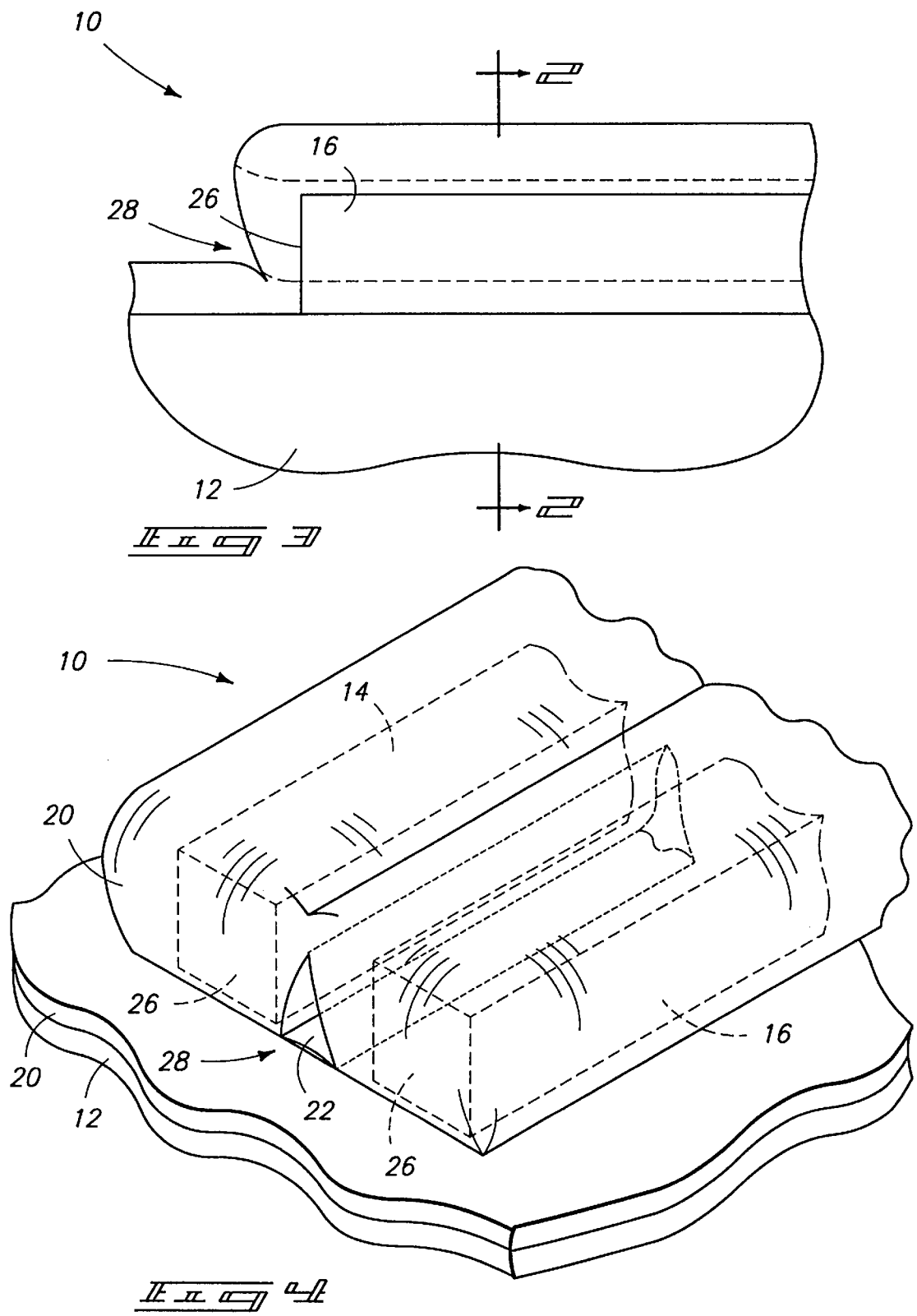

INTEGRATED CIRCUITRY HAVING A PAIR OF ADJACENT CONDUCTIVE LINES AND METHOD OF FORMING

This patent resulted from a continuation application of U.S. patent application Ser. No. 08/898,530, filed Jul. 22, 1997, pending, which is a continuation of U.S. patent application Ser. No. 08/580,281, filed Dec. 27, 1995, now U.S. Pat. No. 5,677,241

This invention was made with Government support under Contract No. MDA972-92-C-0054 awarded by Advanced Research Projects Agency (ARPA). The Government has certain rights in this invention.

TECHNICAL FIELD

This invention relates to integrated circuitry having a pair of adjacent conductive lines, and to methods of forming such circuitry.

BACKGROUND OF THE INVENTION

Integrated circuitry, such as memory circuitry, often includes a series of closely spaced repeating conductive lines formed relative to a semiconductor substrate or underlying insulating layer. A never-ending goal in semiconductor processing is to provide smaller and denser circuits. Such results in conductive lines being placed closer and closer together. Electrical isolation therebetween becomes a greater and greater challenge. The lines are typically separated and electrically isolated by electrically insulating material. However, the adjacent conductive lines can effectively form capacitor plates, with the insulating material therebetween undesirably forming a capacitor dielectric layer. The parasitic or undesired capacitors which form can cause cross-talk between the lines, disrupting circuit operations One prior art technique of overcoming this problem is to use insulating materials having inherently low dielectric constants to avoid such capacitors from forming in the first place. However, deposition of such materials can be difficult to incorporate into conventional semiconductor fabrication processes. Regardless, the improvement in dielectric constant will typically still be insufficient to prevent considerable cross-talk between closely spaced lines.

BRIEF DESCRIPTION OF THE DRAWINGS

Preferred embodiments of the invention are described below with reference to the following accompanying drawings.

FIG. 3 is a sectional view taken through line 3—3 in FIG. 2. The FIG. 2 cut is relative to line 2—2 in FIG. 3.

FIG. 4 is a diagrammatic isometric view of FIG. 2.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming integrated circuitry comprises the following steps:

providing a pair of spaced and adjacent electrically conductive elongated lines; and providing electrically insulative material over the pair of spaced lines in a manner which leaves an elongated void between the lines, the elongated void being top sealed along its substantial elongated length.

In accordance with another aspect of the invention, a method of forming integrated circuitry comprises the following steps:

providing a pair of spaced and adjacent electrically conductive elongated lines, the lines having respective sidewalls;

depositing electrically insulative material over the pair of lines in a manner which produces a retrograde cross-sectional profile of the insulating material relative to the respective line sidewalls and which leaves an elongated top sealed void within the insulating material between the lines, the elongated void being open at at least one end; and sealing the void at the one end.

In accordance with still a further aspect of the invention, integrated circuitry comprises:

a pair of spaced and adjacent electrically conductive elongated lines; and the pair of conductive lines being encapsulated with an electrically insulative material, a top sealed elongated void provided relative to the electrically insulative material between the lines facilitating electrical isolation of the lines from one another.

Figure 1:
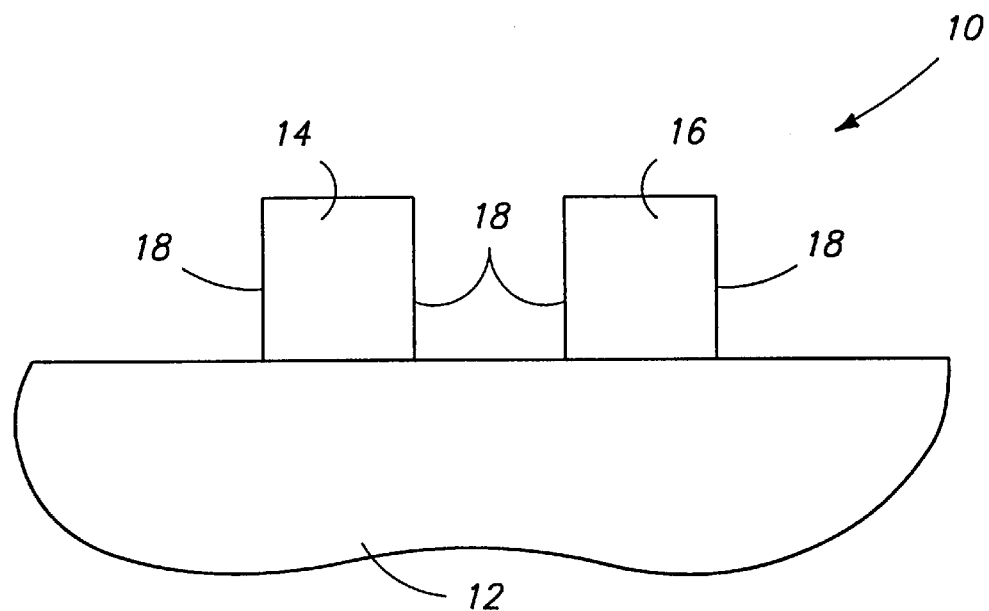
FIG. 1 is a diagrammatic sectional view of a semiconductor wafer fragment at one processing step in accordance with the invention.

Referring first to FIG. 1, a semiconductor wafer fragment in process is indicated generally with reference numeral 10. Such comprises a substrate 12 and a pair of spaced and adjacent electrically conductive elongated lines 14 and 16. Substrate 12 might comprise a monocrystalline silicon substrate or an underlying insulating layer, and regardless is not particularly material to the invention. For purposes of the continuing discussion, elongated lines 14 and 16 include respective sidewalls 18. The invention is described with reference to processing occurring relative to two lines 14 and 16. However as the artisan will appreciate, the processing will most typically have many more additional adjacent lines and have applicability thereto.

Figure 2:
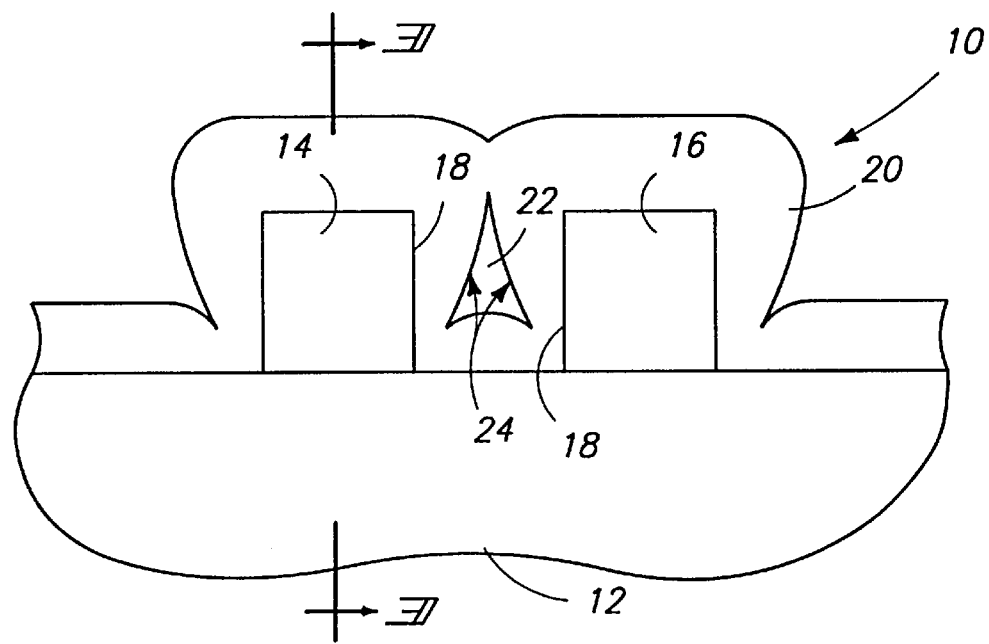
FIG. 2 is a view of the FIG. 1 wafer fragment at a processing step subsequent to that illustrated by FIG. 1.

Referring to FIGS. 2, 3 and 4, electrically insulative material is provided over the pair of spaced lines 14 and 16 in an manner which leaves an elongated void 22 therebetween. Elongated void 22 is top sealed along its substantial elongated length. The preferred manner by which layer 20 is provided is by plasma enhanced chemical vapor deposition (PECVD) in a manner which produces the illustrated retrograde or cusping, back-angle cross-sectional profile 24 relative to the opposing respective line sidewalls 18. An example deposition technique to produce the illustrate sealed void profile is, in a single wafer parallel plate plasma deposition reactor, Pressure: 11 Torr
Power: 850 Watts
Temp.: 400° C.
$O_2$ flow: 900 sccm
TEOS flow: 2500 sccm.

FIGS. 3 and 4 illustrate lines 14 and 16 as having respective adjacent ends 26. Elongated void 22 has at least one open end 28, with opening 28 effectively being at or adjacent line ends 26. FIG. 3 also illustrates opening 28 as having a cusped or retrograde profile relative to line ends 26. This retrograde profile is typically undesirable, as subsequent deposition steps have a greater tendency to not perfectly conform to the retrograde profile. This can result in undesired voids. Further, only one end to the respective lines 14 and 16 is shown. It is to be understood, however, that elongated void 22 might be open at both or intermediate its ends, with only one end being shown for clarity and ease of description.

As background pertinent to the following description, photoresist processing and its associated patterning will typically be conducted in processes subsequent to that depicted by FIGS. 2–4 for completing fabrication of the desired integrated circuitry. Typical photoresist processing steps make it highly desirable to seal illustrated void 28. For example, photoresist after its deposition is typically subjected to a high temperature and quick bake to drive solvents therefrom. This rapid solvent bake and driving process can cause significant out diffusion of ambient gases from within a plurality of the voids 22. This outgassing will undesirably bubble through and disrupt the photoresist processing. Accordingly, it is highly desirable to seal the ends of voids formed in accordance with the invention to both, a) overcome the outgassing problem associated with photoresist processing, and b) remove the FIG. 3 retrograde profile of opening 28.

The invention contemplates attending to such sealing in some manners which utilize photoresist, and in other manners which do not. The discussion proceeds initially with description of a photoresist process utilized for sealing the elongated void open ends and removing a retrograde profile.

Figure 5:
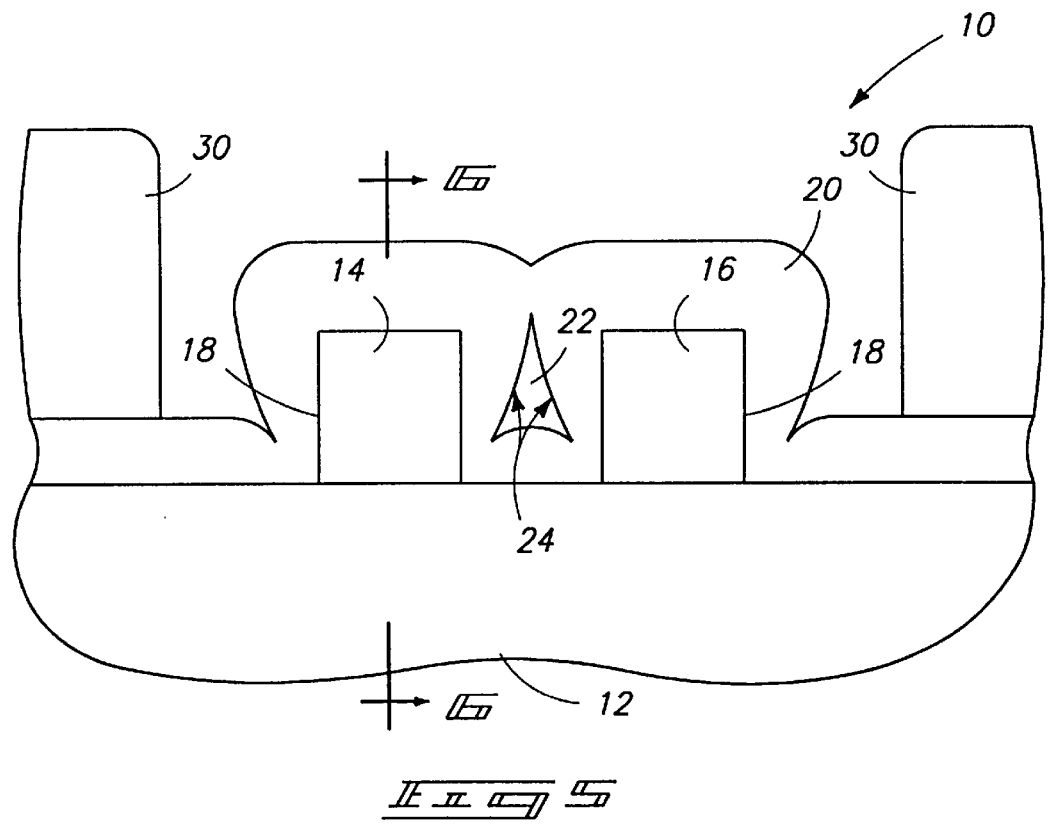
FIG. 5 is a view of the FIG. 1 wafer fragment at a processing step subsequent to that illustrated by FIG. 2.
Figure 6:
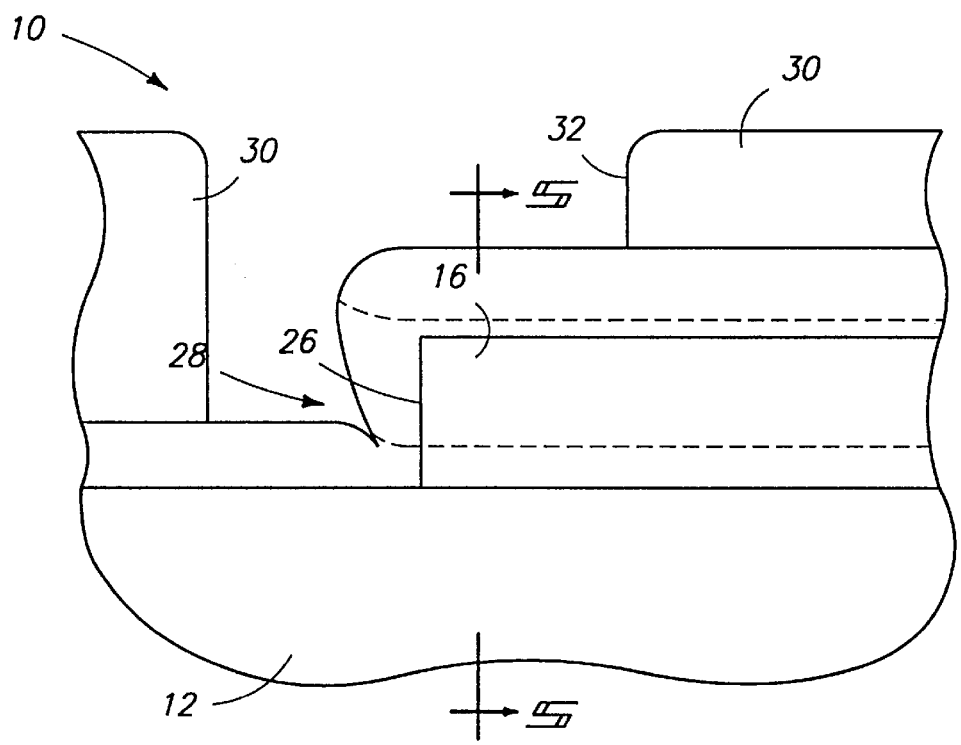
FIG. 6 is a sectional view taken through line 6—6 in FIG. 5. The FIG. 5 cut is relative to line 5—5 in FIG. 6.

Specifically, FIGS. 5 and 6 illustrate deposition and patterning of a layer of photoresist 30 in a manner which leaves void end 28 outwardly open or exposed through photoresist 30. In the preferred embodiment, the photoresist is patterned to define an edge 32 thereof which is effectively recessed relative to line ends 26, such that edge 32 does not necessarily coincide with line ends 26. Preferably, photoresist processing to produce the FIGS. 5 and 6 construction is chosen to minimize outgassing problems relative to the end of void opening 28. Such will preferably include a low temperature bake before pattern exposure, such as at 70° C. for 3 minutes. If a higher temperature bake is desired, the resist could be coated onto the wafer at an elevated temperature to reduce the outgassing at the subsequent bake.

Figure 7:
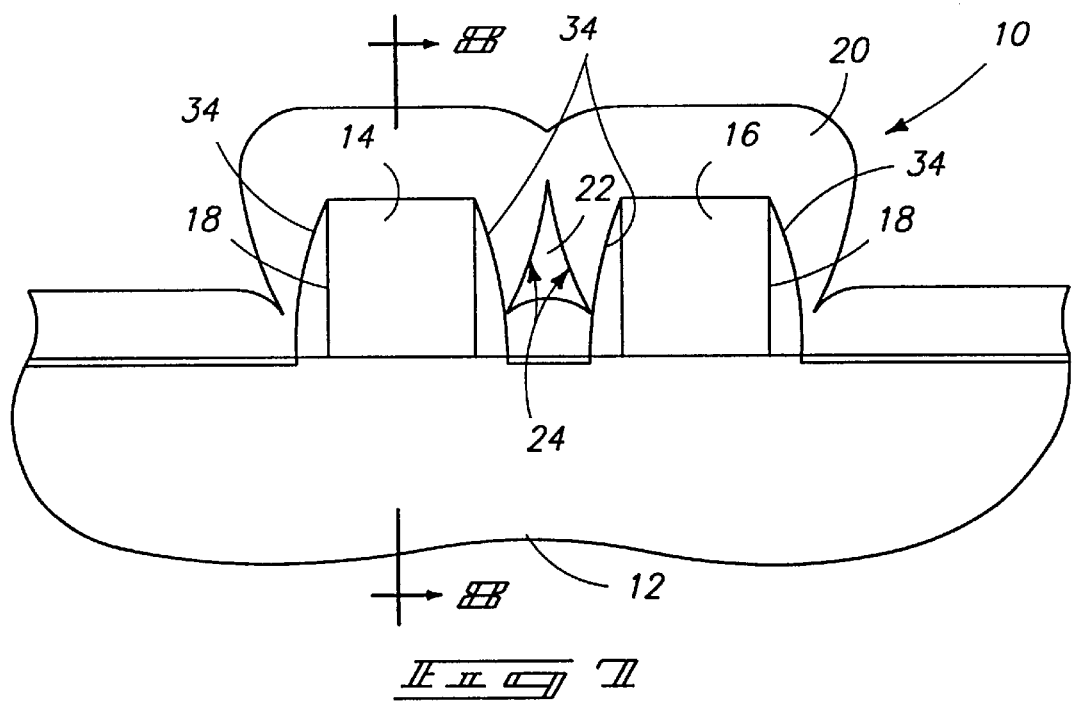
FIG. 7 is a view of the FIG. 1 wafer fragment at a processing step subsequent to that illustrated by FIG. 5.
Figure 8:
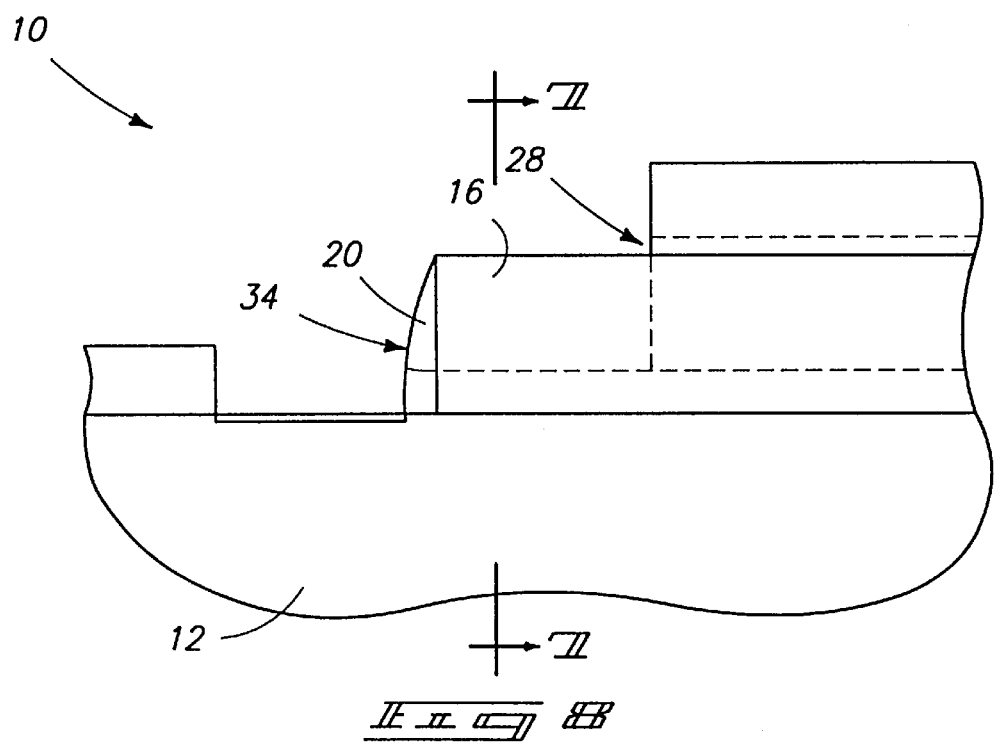
FIG. 8 is a sectional view taken through line 8—8 in FIG. 7. The FIG. 7 cut is relative to line 7—7 in FIG. 8.
Figure 9:
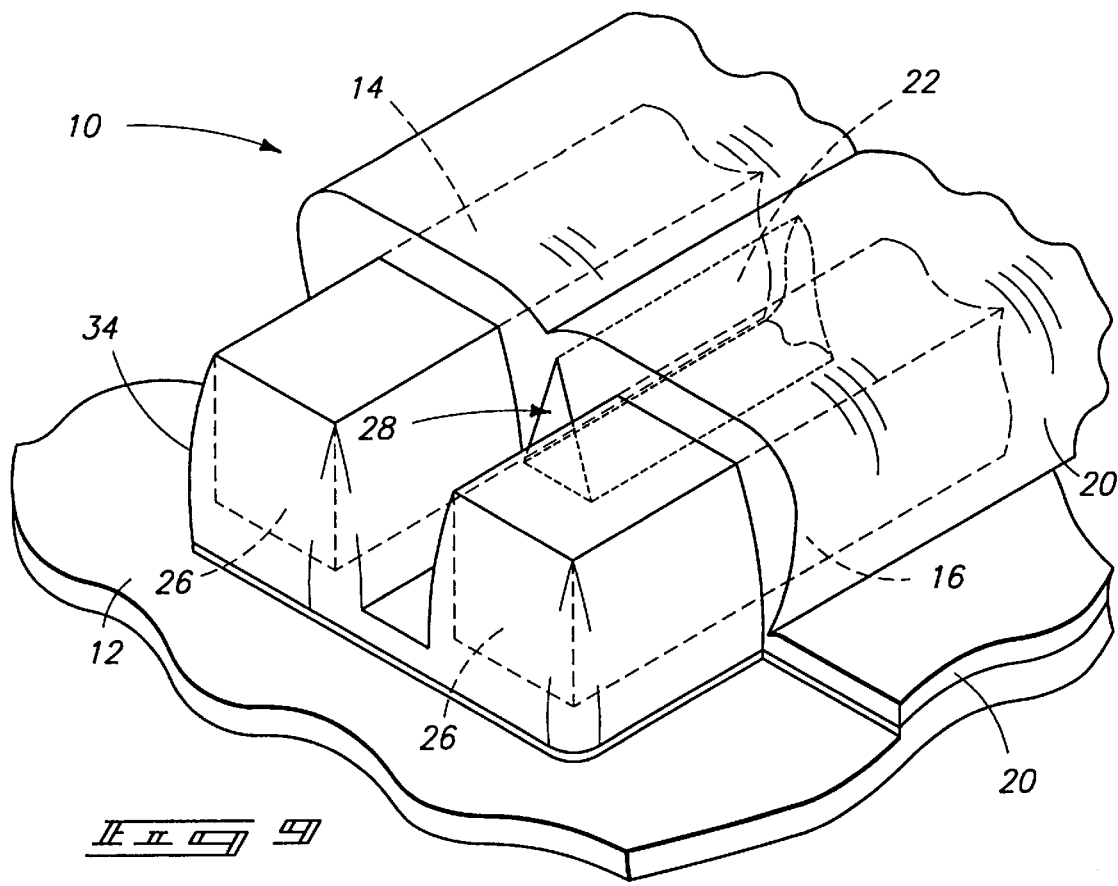
FIG. 9 is a diagrammatic isometric view of FIG. 7.

Referring to FIGS. 7, 8 and 9, the insulating material 20 exposed through the photoresist is anisotropically etched to both, a) remove the retrograde profile of exposed insulating material at the ends 26 of lines 14 and 16, and thus produce a prograde profile 34, and b) move void opening 28 from the ends 26 of lines 14 and 16, and provide the moved void opening 28 with other than a retrograde profile. Such etching might also result in some substrate overetch, as illustrated. In this described embodiment, the anisotropic etching produces a substantially vertical profile for moved opening 28, and is thus neither retrograde nor prograde. Art conventional etching techniques would be utilized to produce the illustrated preferred vertical and prograde profiles.

Figure 10:
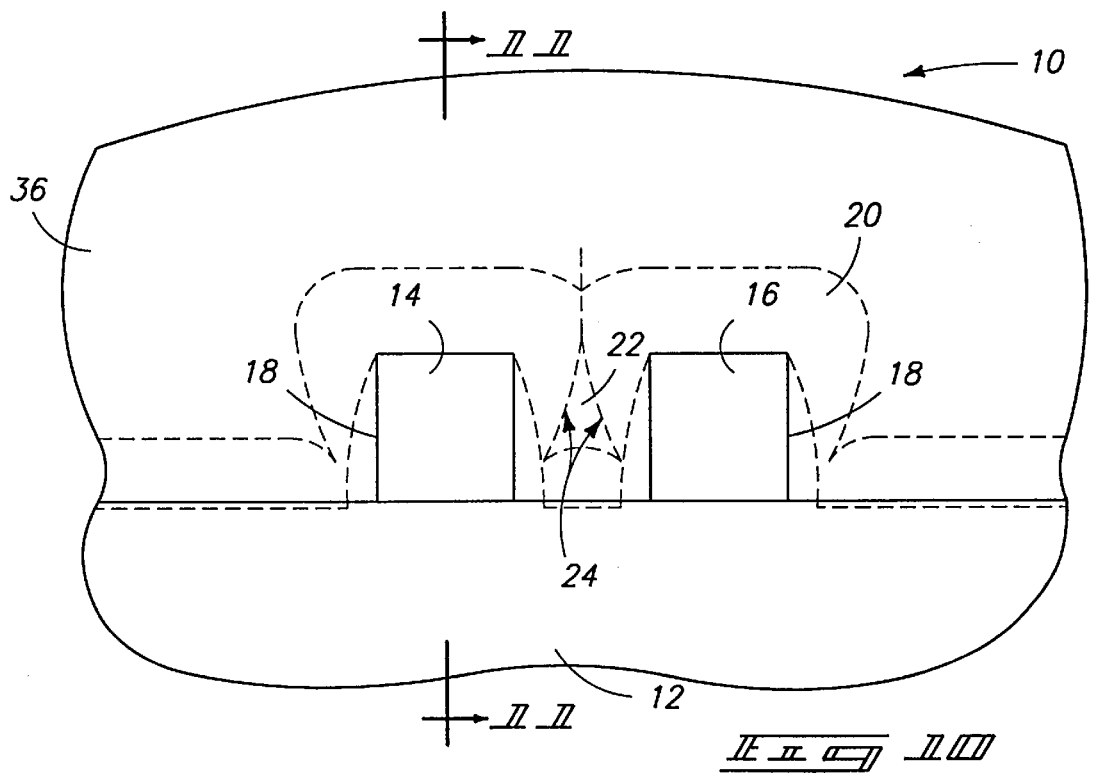
FIG. 10 is a view of the FIG. 1 wafer fragment at a processing step subsequent to that illustrated by FIG. 7.
Figure 11:
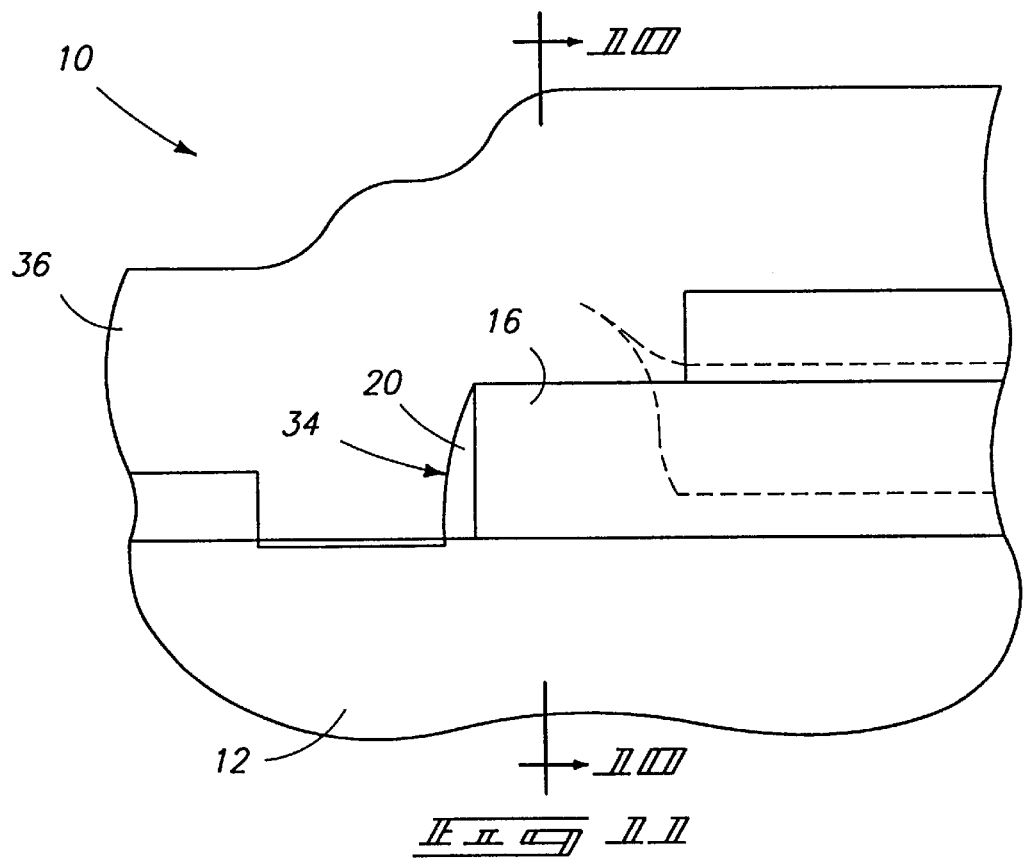
FIG. 11 is a sectional view taken through line 11—11 in FIG. 10. The FIG. 10 cut is relative to line 10—10 in FIG. 11.

Referring to FIGS. 10 and 11, an insulating material layer 36 such as spin-on-glass, is deposited to effectively seal moved void 28 as shown. Thus in the preferred embodiment, thee retrograde profiles are removed and the void ends are sealed. The void end effectively thereby has a sealed prograde profile thereat.

Figure 12:
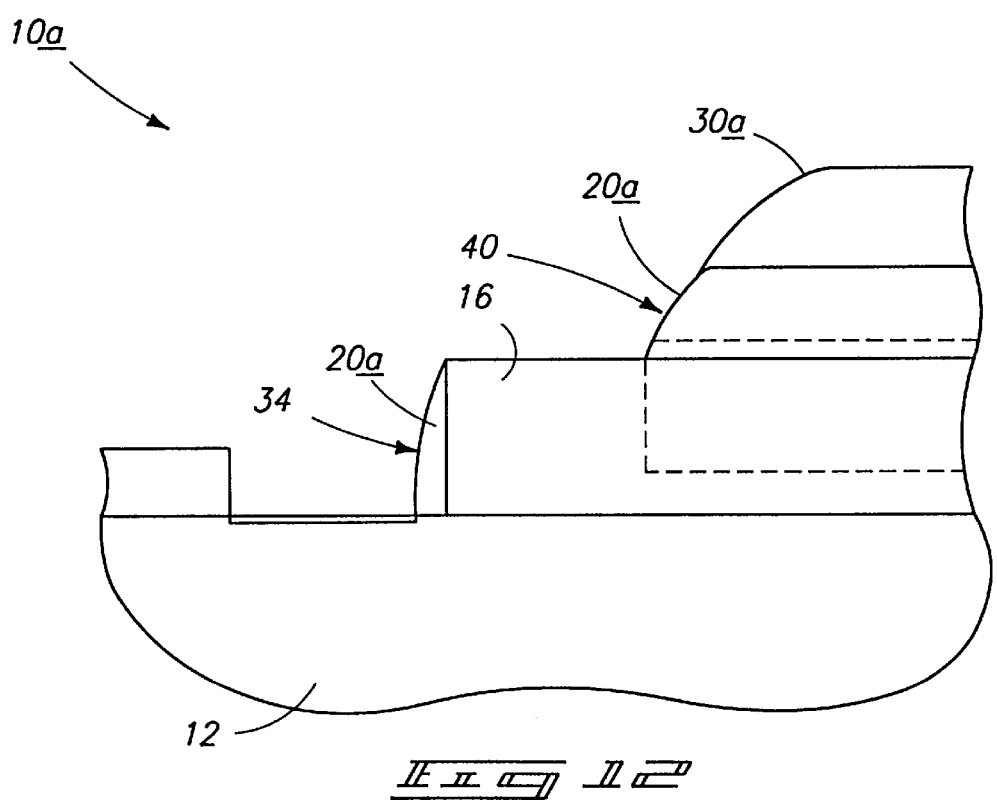
FIG. 12 is an alternate sectional view to that depicted by FIG. 8 illustrating an alternate processing step in accordance with the invention.

FIG. 12 illustrates an alternate embodiment technique corresponding to that of FIG. 8 for removing the retrograde profile of moved void opening 28. Like numerals from the first described embodiment are utilized where appropriate, with differences being indicated with the suffix "a" or with different numerals. Here, wafer fragment 10a has been subjected to erosion etching of the exposed insulating material 20a in a manner which removes the retrograde profile of exposed insulating material at the void end 28. However here, the void opening is provided with a prograde profile 40, as opposed to a substantially vertical profile of the FIG. 8 processing. Further, the erosion etching is such that preferably photoresist layer 30a is also effectively erosion etched. An example and preferred processing technique for achieving such etching utilizes $CF_4/O_2$ or $CHF_3/O_2$ chemistry in respective 70%/30% mixtures, at 600 Watts and 500 mTorr.

Figure 13:
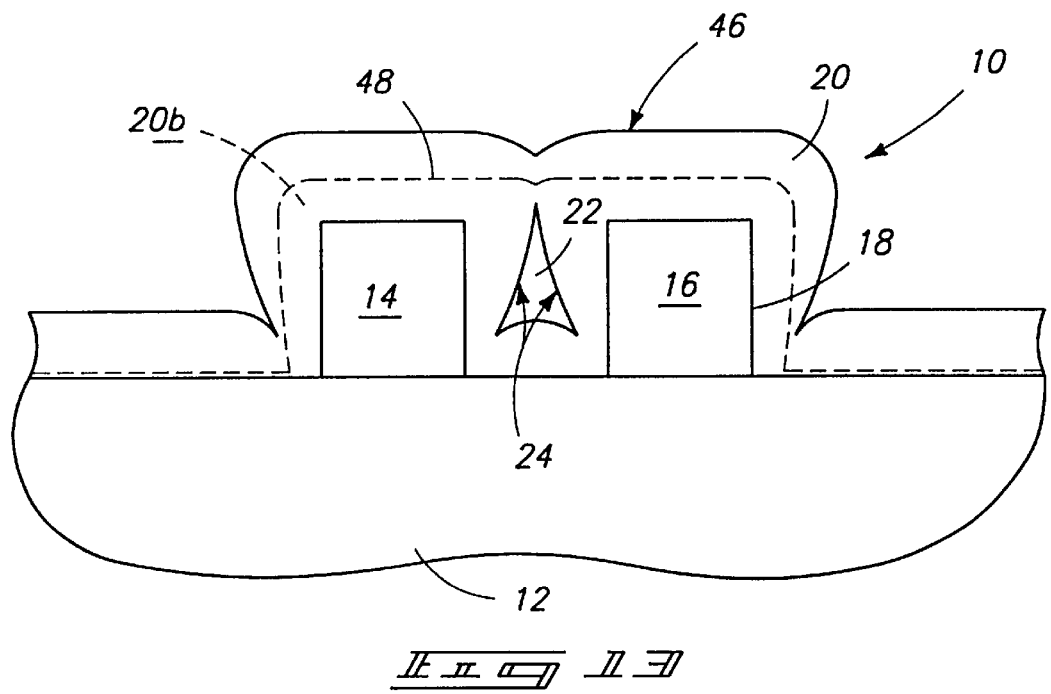
FIG. 13 is an alternate sectional view to that depicted by FIG. 5 illustrating an alternate processing step in accordance with the invention.
Figure 14:
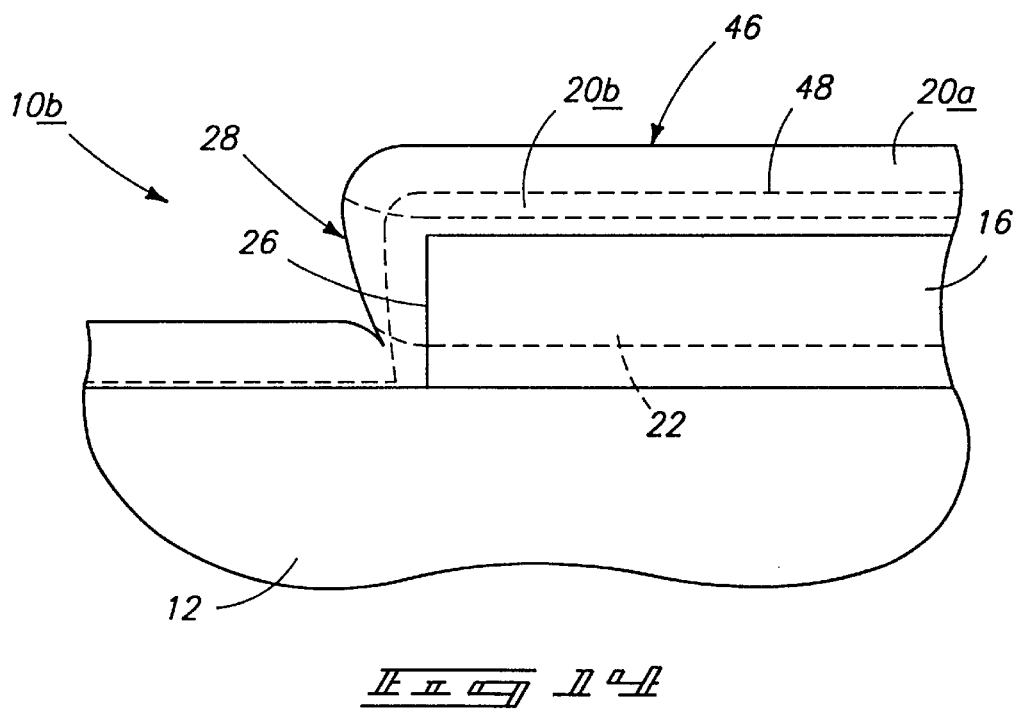
FIG. 14 is an alternate sectional view to that depicted by FIG. 6 corresponding to the processing step of FIG. 13.

Yet another alternate embodiment is described with reference to FIGS. 13–20. Like numerals from the first described embodiment are utilized where appropriate, with differences being indicated by the suffix "b" or with different numerals. This particular embodiment provides for sequential reduction and ultimate removal of the retrograde profile without using photoresist masking relative to wafer locations where the retrograde profiles exists. FIGS. 13 and 14 correspond to figure pair 5 and 6 of the first described embodiment. Insulating material layer 20 is shown as having an initial or original outline 46. A first anisotropic etching step will be conducted to etch only partially into insulating material 20 to reduce the retrograde profile to a new profile outline 48, with the etching yet being insufficient to open the top of elongated void 22. The result is layer 20b.

Figure 15:
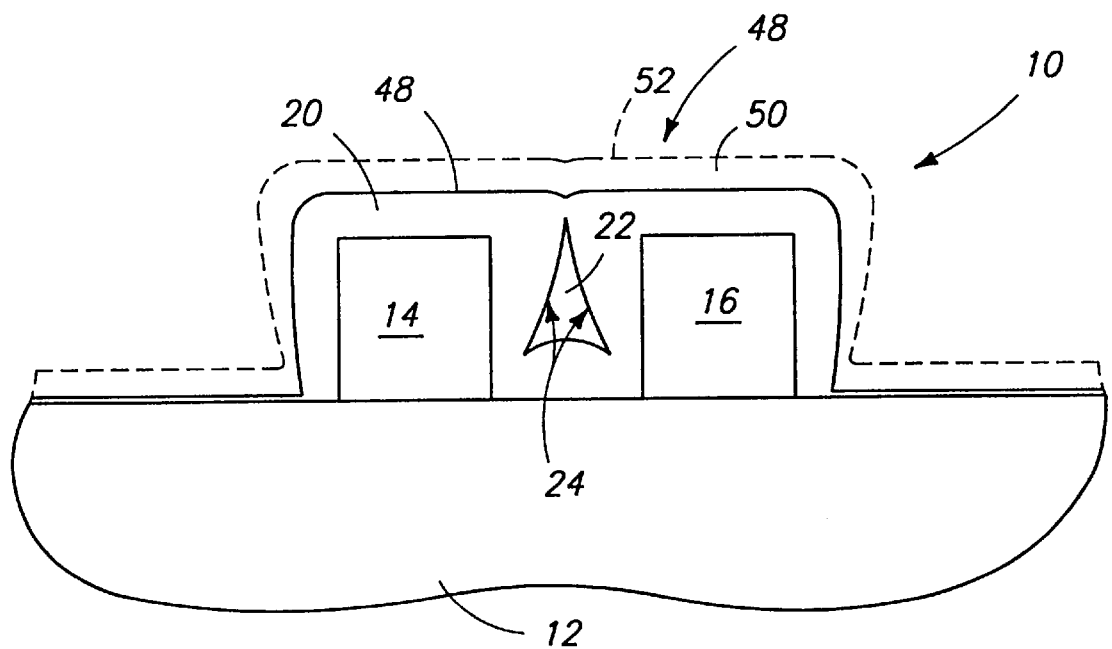
FIG. 15 is a view of the FIG. 13 wafer at a processing step subsequent to that shown in FIG. 13.
Figure 16:
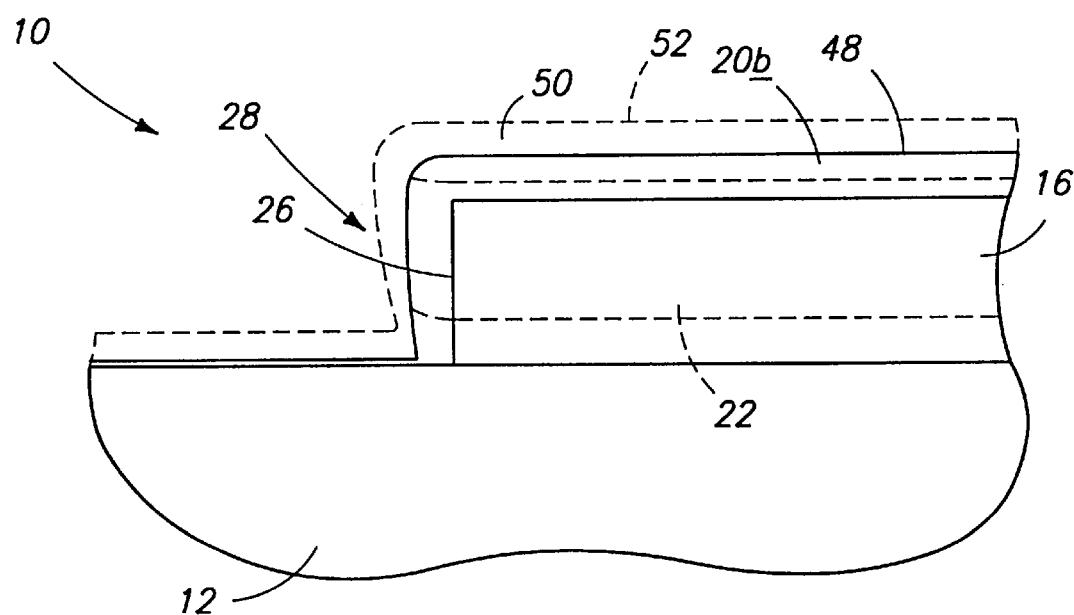
FIG. 16 is a view of the FIG. 14 wafer at a processing step subsequent to that shown in FIG. 14.

FIGS. 15 and 16 illustrate profile outline 48 wherein the degree of retrograde has been reduced over that of profile 46 of FIGS. 13 and 14. To further facilitate removal of the retrograde profile of partially anisotropically etched layer 20b, an insulating material layer 50 is deposited over anisotropic partial etched insulating material profile 48. Such results in an outer profile 52.

Figure 17:
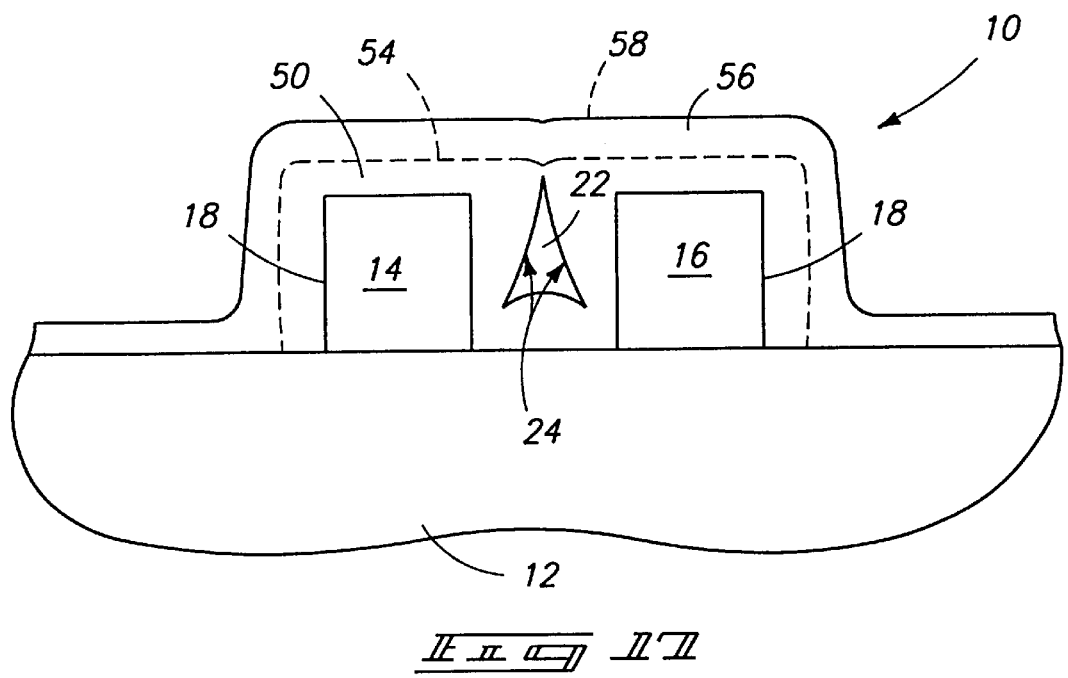
FIG. 17 is a view of the FIG. 13 wafer at a processing step subsequent to that shown in FIG. 15.
Figure 18:
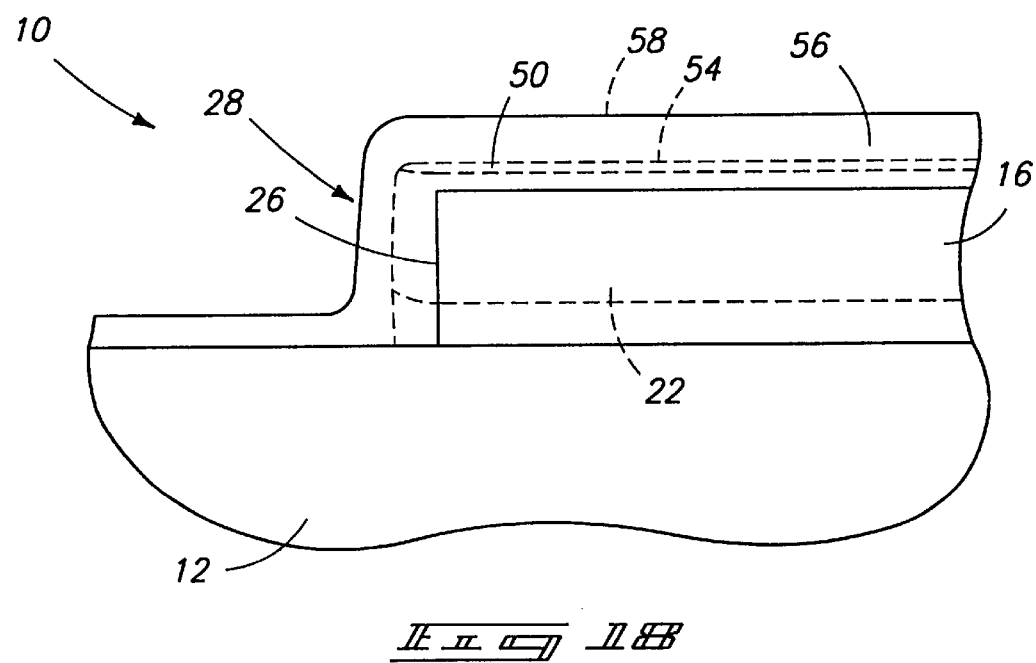
FIG. 18 is a view of the FIG. 14 wafer at a processing step subsequent to that shown in FIG. 16.
Figure 19:
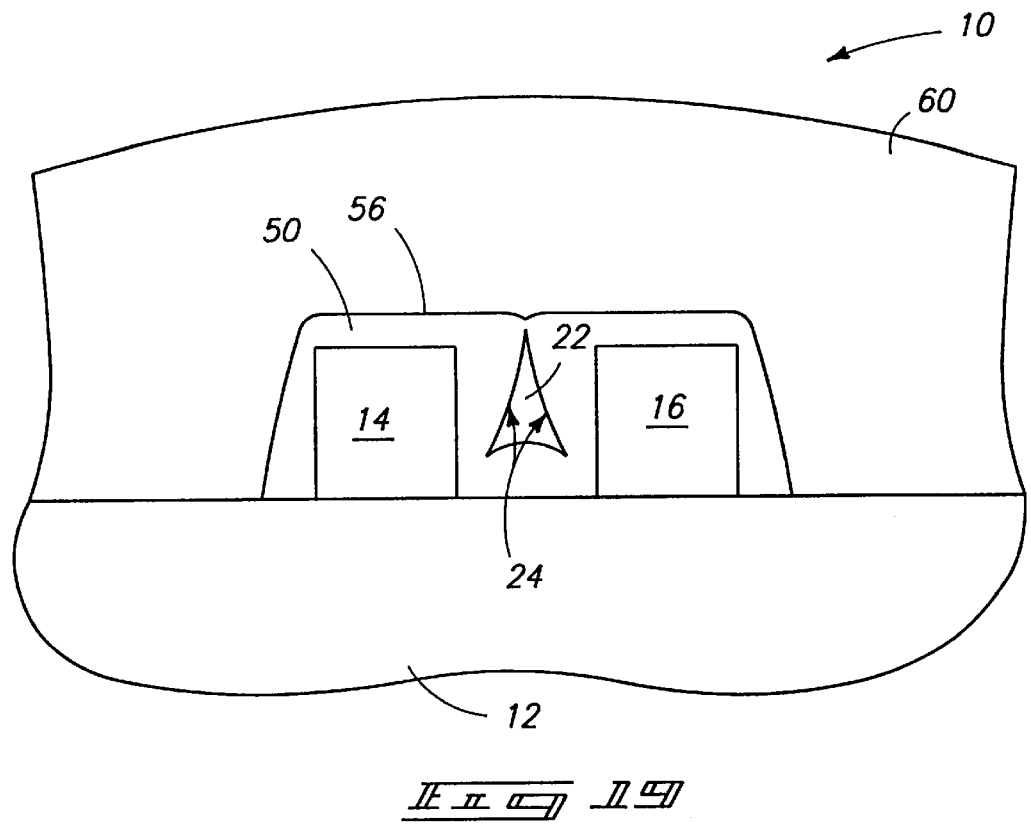
FIG. 19 is a view of the FIG. 13 wafer at a processing step subsequent to that shown in FIG. 17.
Figure 20:
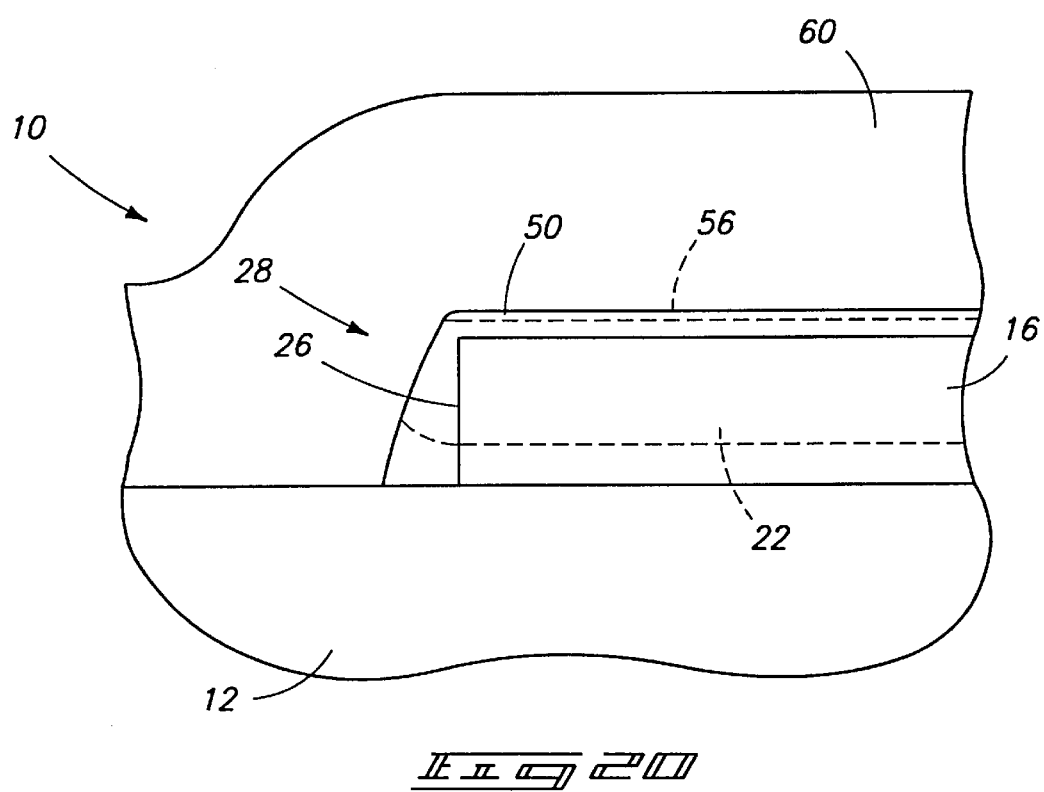
FIG. 20 is a view of the FIG. 14 wafer at a processing step subsequent to that shown in FIG. 18.

Referring to FIGS. 17 and 18, insulating layer 50 is anisotropically etched only partially to reduce or effectively eliminate retrograde profile 52 to a new profile 54, but not sufficiently to open top of elongated void 22 between the lines. The sequence of anisotropic etching, depositing, and then further anisotropic etching is repeated in the preferred embodiment at least until the retrograde profile is removed, and preferably to a point where a prograde profile is provided. FIG. 17 and 18 illustrate subsequent deposition of another insulating layer 56 having an outer profile 58. FIGS. 19 and 20 illustrate a subsequent anisotropic etch thereof to produce the illustrated prograde profile outline 56. Subsequently, an insulating material layer 60 is deposited to ultimately seal void 22 and provide the illustrated and desired prograde profile.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of forming integrated circuitry comprising the following steps:

providing a pair of spaced electrically conductive elongated lines, the lines having respective ends;

forming electrically insulative material proximate the pair of lines in a manner which leaves a void within the insulating material between the lines, the void having an opening at a portion of the insulative material proximate at least one of the respective line ends, the insulative material at said portion having a retrograde profile relative to the at least one of the respective line ends; and removing the retrograde profile of said portion.

2. The method of forming integrated circuitry of claim 1 wherein the removing the retrograde profile comprises replacing the retrograde profile with either a substantially vertical profile or a prograde profile.

3. The method of forming integrated circuitry of claim 1 further comprising:

after removing the retrograde profile, sealing the void opening.

4. The method of forming integrated circuitry of claim 1 wherein the lines have respective adjacent ends, the depositing step providing the void opening proximate the adjacent line ends.

5. The method of forming integrated circuitry of claim 1 further comprising:

moving the void opening after the depositing step.

6. The method of forming integrated circuitry of claim 1 wherein the step of sealing the one void end comprises:

depositing and patterning a layer of photoresist over the insulating material to leave the void opening extending through the photoresist and to leave exposed insulating material proximate the void opening;

anisotropically etching the exposed insulating material to remove the retrograde profile of the exposed insulating material proximate the void opening; and after the anisotropic etching step, depositing an insulating material to seal the void.

7. The method of forming integrated circuitry of claim 1 further comprising:

after removing the retrograde profile, sealing the void opening; wherein the elongated void has a top between the lines, and wherein the step of sealing the void opening comprises;

without using photoresist masking, first anisotropically etching only partially into the insulating material to reduce the retrograde profile but not sufficiently to open the top of the elongated void between the lines;

first depositing an insulating layer over the anisotropic partial etched insulating material; and repeating the first anisotropic etching and first depositing steps effectively to remove the retrograde profile and seal the void.

8. A method of forming integrated circuitry comprising the following steps:

forming a pair of spaced and adjacent electrically conductive elongated lines;

forming electrically insulative material proximate the pair of spaced lines in a manner which forms an elongated void between the lines, the elongated void having an open end; and moving the open end.

9. The method of forming integrated circuitry of claim 8 further comprising:

after moving the open end, sealing the open end.

10. A method of forming integrated circuitry comprising the following steps:

providing a pair of spaced and adjacent electrically conductive elongated lines;

forming electrically insulative material proximate the pair of lines in a manner which forms an elongated top sealed void within the insulating material between the lines, the elongated void being open at at least one end; and after forming the electrically insulative material, sealing the void at the at least one end that is open.

11. A method of forming integrated circuitry comprising the following steps:

providing a pair of spaced and adjacent electrically conductive elongated lines, the lines having respective ends;

forming electrically insulative material proximate the pair of lines in a manner which produces a retrograde cross-sectional profile of the insulating material relative to the respective line ends and which leaves an elongated top sealed void within the insulating material between the lines, the elongated void having a pair of opposing ends and being open at at least one of the opposing ends; and sealing the void at the at least one end, the step of sealing the at least one end of the void comprising:

depositing and patterning a layer of photoresist over the insulating material to leave the void outwardly open through the photoresist;

anisotropically etching the exposed insulating material in a manner which removes the retrograde profile of exposed insulating material at the void end opening; and after the anisotropic etching step, depositing an insulating material to seal the void.

12. The method of forming integrated circuitry of claim 11 wherein the anistropically etching comprises erosion etching.

13. The method of forming integrated circuitry of claim 11 wherein the lines have respective adjacent ends, the void opening at least initially being provided at the adjacent line ends; and the step of sealing the at least one end of the void lend comprising:

provide the patterned photoresist to have an edge recessingly positioned over the lines; and conducting the erosion etching to both, a) remove the retrograde profile of exposed insulating material at the ends of the lines, and b) move the void opening from the ends of the lines and provide the moved void opening with other than a retrograde profile.

14. A method of forming integrated circuitry comprising the following steps:

providing a pair of spaced and adjacent electrically conductive elongated lines, the lines having respective ends;

chemical vapor depositing electrically insulative material over the pair of lines in a manner which produces a retrograde profile of the insulating material relative to at least one of the respective line ends and which leaves an elongated top sealed void within the insulating material between the lines, the elongated void being open at at least one end;

removing the retrograde profile at the at least one end and replacing it with either a substantially vertical profile or a prograde profile; and after removing the retrograde profile, sealing the void at the at least one end.

* * * * *

UNITED STATES PATENT AND TRADEMARK OFFICE
CERTIFICATE OF CORRECTION

PATENT NO : 5,981,397
DATED : November 9, 1999
INVENTOR(S) : H. Montgomery Manning It is certified that error appears in the above-identified patent and that said Letters Patent is hereby corrected as shown below:

Col. 4, line 29
 replace "thee"
 with --the--.

Signed and Sealed this

Fourteenth Day of November, 2000

Attest:

Q. TODD DICKINSON

*Attesting Officer*  *Director of Patents and Trademarks*